United States Patent
Yu et al.

(10) Patent No.: US 7,588,995 B2
(45) Date of Patent: Sep. 15, 2009

(54) METHOD TO CREATE DAMAGE-FREE POROUS LOW-K DIELECTRIC FILMS AND STRUCTURES RESULTING THEREFROM

(75) Inventors: Chen-Hua Yu, Hsin-Chu (TW); Ching-Ya Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 374 days.

(21) Appl. No.: 11/273,701

(22) Filed: Nov. 14, 2005

(65) Prior Publication Data

US 2007/0111535 A1    May 17, 2007

(51) Int. Cl.
H01L 21/76    (2006.01)
H01L 21/31    (2006.01)

(52) U.S. Cl. .................. 438/409; 438/960; 438/758; 257/E21.151

(58) Field of Classification Search .......... 438/409, 438/758, 960; 257/E21.151
See application file for complete search history.

(56) References Cited

U.S. PATENT DOCUMENTS

| | | | |
|---|---|---|---|
| 4,474,994 A | 10/1984 | Makin | |
| 4,594,311 A | 6/1986 | Frisch et al. | |
| 5,185,296 A | 2/1993 | Morita et al. | |
| 5,304,515 A | 4/1994 | Morita et al. | |
| 5,369,033 A | 11/1994 | Di Milia et al. | |
| 5,403,621 A | 4/1995 | Jackson et al. | |
| 5,665,527 A | 9/1997 | Allen et al. | |
| 5,710,187 A | 1/1998 | Steckle, Jr. et al. | |
| 5,868,862 A | 2/1999 | Douglas et al. | |
| 5,908,510 A | 6/1999 | McCullough et al. | |
| 5,914,183 A | 6/1999 | Canham | |
| 6,140,221 A * | 10/2000 | Annapragada et al. | 438/622 |
| 6,194,650 B1 | 2/2001 | Wakayama et al. | |
| 6,260,562 B1 | 7/2001 | Morinishi et al. | |
| 6,329,017 B1 | 12/2001 | Liu et al. | |
| 6,440,337 B1 | 8/2002 | Hanna et al. | |
| 6,444,715 B1 | 9/2002 | Mukherjee et al. | |
| 6,486,078 B1 | 11/2002 | Rangarajan et al. | |
| 6,528,409 B1 * | 3/2003 | Lopatin et al. | 438/618 |
| 6,875,709 B2 | 4/2005 | Lin et al. | |
| 6,989,172 B2 | 1/2006 | DeYoung et al. | |
| 7,166,531 B1 * | 1/2007 | van den Hoek et al. | 438/623 |
| 7,335,586 B2 * | 2/2008 | RamachandraRao et al. | 438/637 |
| 2002/0115285 A1 * | 8/2002 | Wong | 438/638 |
| 2003/0033676 A1 | 2/2003 | DeYoung et al. | |
| 2003/0116176 A1 | 6/2003 | Rothman et al. | |

* cited by examiner

*Primary Examiner*—Alexander G Ghyka
*Assistant Examiner*—Seahvosh J Nikmanesh
(74) *Attorney, Agent, or Firm*—Slater & Matsil, L.L.P.

(57) ABSTRACT

Low dielectric constant dielectric films having a high degree of porosity suffer from poor mechanical strength and can be damaged during processing steps. Damage can be substantially eliminated or minimized by stuffing the pores of the dielectric film with a material that substantially fills the pores. The stuffing material should have low surface tension and viscosity to provide good wetting. Alternatively, the stuffing material can be dissolved in a wetting carrier fluid, such as supercritical carbon dioxide and the like.

18 Claims, 4 Drawing Sheets

METHOD TO CREATE DAMAGE-FREE POROUS LOW-K DIELECTRIC FILMS AND STRUCTURES RESULTING THEREFROM

FIELD OF THE INVENTION

The present invention relates generally to semiconductor processes for dielectric layers with low dielectric constants and more particularly to a method for forming a low dielectric constant material with minimal damage resulting from subsequent processing steps.

BACKGROUND OF THE INVENTION

Dielectric layers with low dielectric constant, or so-called low-k and extremely low-k dielectric layers are becoming an increasingly popular material in the manufacture of semiconductor devices. Low-k dielectric materials are particularly valuable as device geometries shrink well below the micron range, with gate lengths approaching 90 nm, 65 nm, 45 nm, and below. This is because dielectric layers are becoming commensurately thinner, as device critical dimensions become smaller. Power is consumed unnecessarily and device switching speed is degraded by stray capacitance between conductors and interconnects. Low-k and extremely low-k dielectrics reduce capacitance between conductors and, hence, alleviate some of these concerns.

While low-k dielectric materials provide improved electrical characteristics, they generally suffer from poor mechanical strength and adhesion. This is due, at least in significant part, to the fact that low-k dielectric materials are typically quite porous, i.e., composed in significant part of air trapped within the matrix of the dielectric material. Air, having a dielectric constant of 1 is an excellent dielectric material, but obviously provides quite poor mechanical strength. The more porous a material is, i.e., the more pores contained within its matrix, the lower its dielectric constant, but also the lower its mechanical strength.

Low-k dielectrics are particularly well suited as inter-metal dielectrics (IMDs), which are typically employed as an insulator layer in which conductive interconnects are formed. Numerous process steps in the formation of the conductive interconnects, however, place the low-k dielectric material under substantial mechanical stress. The result can be significant degradation to not only the mechanical properties of the dielectric layer, but also the electrical properties. Back-end-of-line processes such as etching, ashing, wet cleaning, and the like, can degrade the low-k dielectric. Processes related to conventional damascene and dual damascene, particularly chemical mechanical polishing (CMP) can also significantly degrade the low-k dielectrics.

FIGS. 1a through 1c illustrate one manner in which semiconductor processes can degrade a low-k dielectric material in a deleterious manner. In FIG. 1a, a porous low-k dielectric material 4 has been formed atop a substrate 2. A mask 6 has been formed atop low-k dielectric material 4 and patterned in a conventional manner, leaving a portion of low-k dielectric material 4 exposed. As shown in FIG. 1a, a fluorine-containing etchant is used to etch an opening 8 in low-k dielectric layer 4. Because of the presence of pores in low-k dielectric material 4 (which, as explained above, give the material its low dielectric constant property) some fluorine species, illustrated schematically as 10, is adsorbed by low-k dielectric material 4 during the etch process and remains within the pores after the etch process has been completed. This process is also schematically illustrated via arrows 12, which represent fluorine species adsorbing into dielectric material 4.

In a subsequent process step, such as a rinse with distilled water as illustrated in FIG. 1b, hydrogen containing species and hydrogen ions 14 come in contact with low-k dielectric material 4 and with the fluorine species trapped within the pores of the material. Other process steps, such as a hydrogen containing plasma step can also deliver hydrogen to the fluorine trapped within low-k dielectric material 4. The hydrogen reacts with the fluorine, forming hydrofluoric acid, HF. The resulting hydrofluoric acid is an etchant and etches large voids 16 within the low-k dielectric material 4.

As illustrated in FIG. 1c, opening 8 in low-k dielectric material 4 is subsequently filled with a conductor 18 such as copper, typically in a conventional damascene process. The large voids 16 in low-k dielectric material 4 cause significant stress, which stress can lead to degraded circuit performance, increased electromigration in the conduct, and possibly an open circuit leading to device failure.

Another adverse consequence of the formation of large voids 16 in low-k dielectric layer 4 is the formation of grains of conductor 18 (typically copper, but alternatively titanium, tantalum, titanium nitride, tantalum nitride, aluminum, or the like) in the low-k dielectric material, such as illustrated in FIG. 1d. These grains of conductor 18 reduce the insulative properties of the material and could, in some circumstances, result in a short circuit between adjacent conductors, again resulting in device failure.

What is needed then is a method for forming a low-k dielectric material that is less sensitive to subsequent processing steps, while still maintaining its desirable electrical properties.

SUMMARY OF THE INVENTION

The above described and other problems are generally solved or circumvented, and technical advantages are generally achieved, by illustrative embodiments of the present invention which provide a method for reducing or eliminating damage to low dielectric constant materials.

In one aspect, embodiments of the invention provides a method for forming an integrated circuit device. The method includes forming over a substrate a low dielectric constant material having a plurality of pores and substantially filling the pores with a stuffing material. The method further includes forming an opening in the low dielectric constant material, forming a conductor in the opening, and removing at least some of the stuffing material from the pores.

In another aspect, embodiments of the invention provides for a method of treating a dielectric layer. The method includes forming a dielectric layer on a surface and treating the dielectric layer to form pores therein. The pores are then substantially filled with a stuffing material and at least one processing step is performed on the dielectric layer after substantially filling the pores. At least some of the stuffing material is removed from the pores after performing the at least one processing step.

In yet another aspect, the invention provides for a method of manufacturing an integrated circuit device comprising depositing on a substrate a layer having a plurality of pores therein. The pores are substantially filled with a stuffing material. The stuffing material is subsequently removed from the pores.

An advantageous feature of the present invention is that so-called low k and extremely low k dielectric materials can be used for their desirable electrical properties, without the undesirable consequences of mechanical weakness that typically accompanies such materials.

DETAILED DESCRIPTION OF ILLUSTRATIVE EMBODIMENTS

Figure 1A:
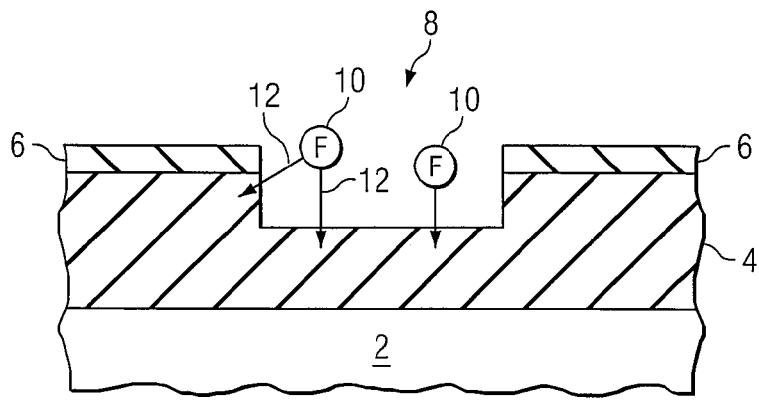
FIGS. 1a through 1d illustrate the formation of voids within a low-k dielectric layer and negative consequences resulting therefrom.
Figure 1B:
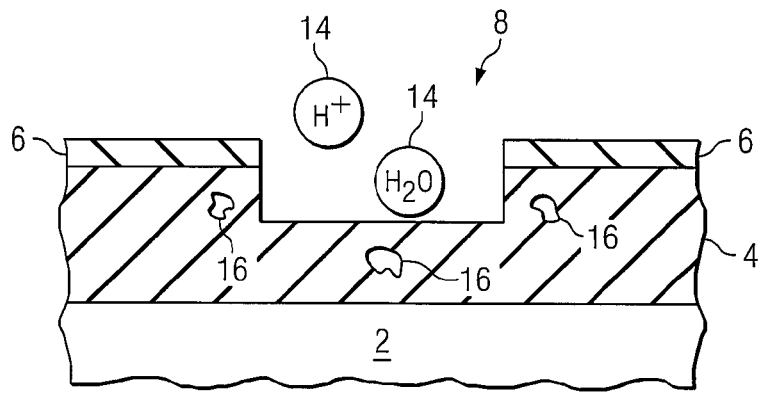
Figure 1C:
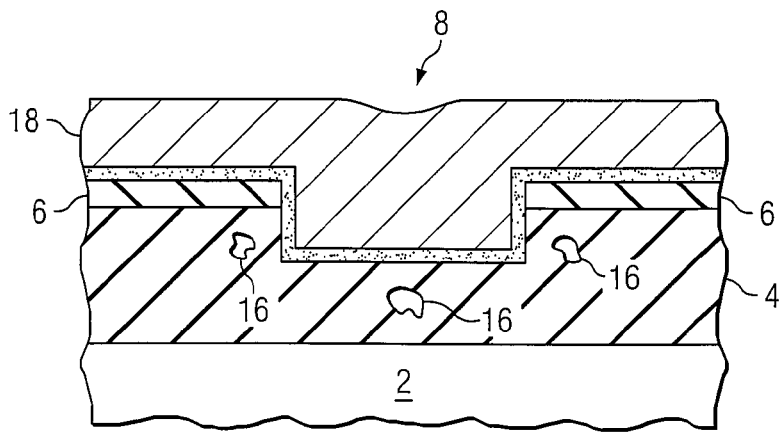
Figure 1D:
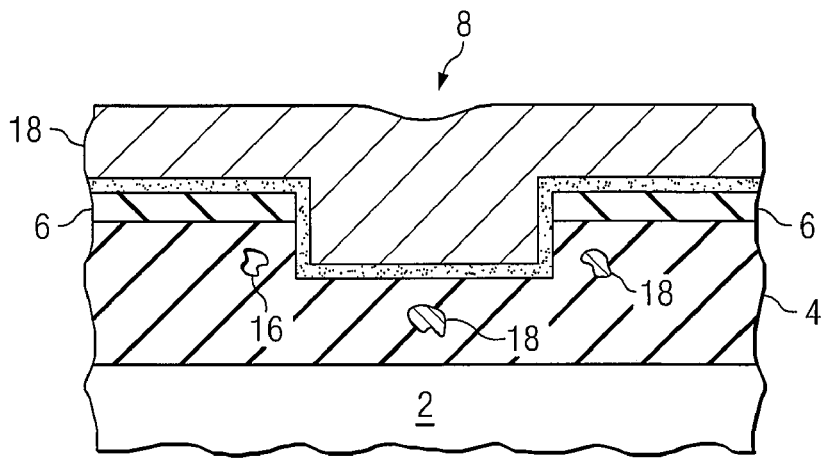
Figure 2:
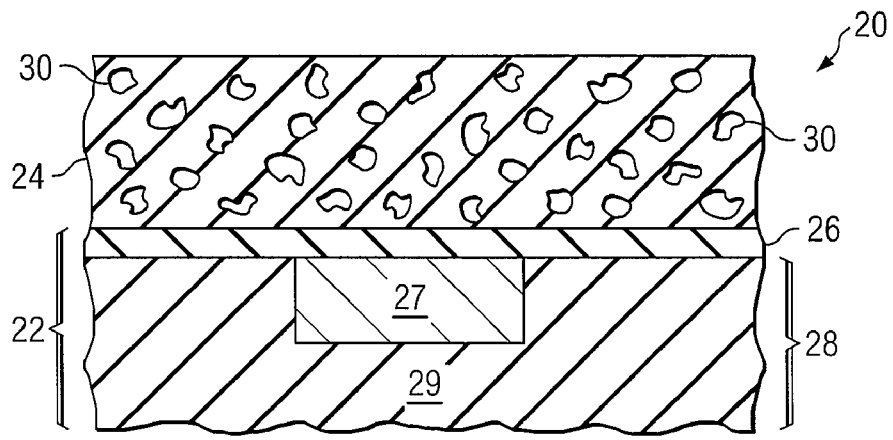
FIG. 2 illustrates in cross section a dielectric material having pores formed therein.

FIG. 2 illustrates an illustrative semiconductor device 20 in an intermediate stage of manufacture. A low-k dielectric material 24 is formed on a substrate 22. In the illustrated embodiment, the substrate 22 comprises an etch stop layer 26 formed atop an underlying layer 28 (which is typically a metallic interconnect 27 formed within another low-k dielectric layer 29 in a conventional damascene manufacturing process). In other embodiments, the substrate 22 comprises a dielectric layer, a metallic layer, a semiconductor layer such as a semiconductor substrate, a conductive region formed within a semiconductor, a polysilicon feature, an oxide or nitride layer, or the like. In many embodiments, the substrate 22 may comprise a combination of several of these layers and materials in numerous underling layers. In the illustrated embodiment, etch stop layer 26 is silicon nitride, although numerous other materials such as silicon oxide, silicon oxynitride, silicon carbide, and the like could be employed.

The low-k dielectric material 24 is preferably silicon based carbon-doped oxide film, such as SiOCH, although the present invention is not limited to a particular low-k material. Other low-k dielectrics, such as polymer-based low-k materials (like polyimide), hydrogen silsequioxane and methyl silsequioxane, could also be employed. In the illustrative embodiment, the low-k dielectric material 24 is deposited by chemical vapor deposition (CVD) or spin on deposition (SOD) to a thickness of preferably about 1000 to about 9000 Angstroms. As is well known in the art, the low-k dielectric material is typically deposited in a native form, and is then subjected to a poregen removing process, such as an e-beam or ultra-violet (UV) treatment to remove the poregen material. This process, which removes or "burns off" the poregen, leaves in its place the pores 30 that provide the desirable low dielectric constant to the material. FIG. 2 illustrates the low-k dielectric material 24 after the UV or e-beam treatment has been performed. One skilled in the art will recognize that the size, placement, and shape of pores 30 are not to scale; rather pores 30 are illustrated schematically for purposes of discussion.

As discussed above, the low-k dielectric material 24 is vulnerable to significant damage during subsequent process steps because of the presence of the pores 30. This vulnerability can be significantly reduced by the introduction of a stuffing material, which stuffing material substantially fills pores 30 and, hence, provides mechanical strength.

Figure 3:
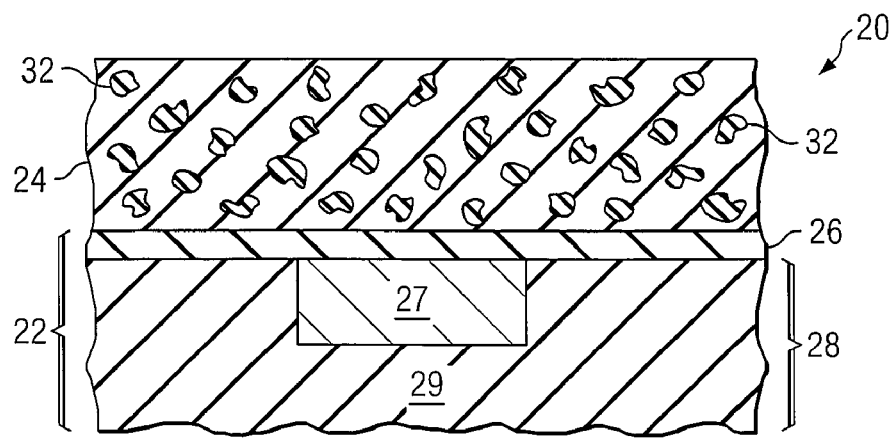
FIG. 3 illustrates the dielectric material of FIG. 2 wherein stuffing material has filled the pores.

FIG. 3 schematically illustrates an exemplary process for filling pores 30 with a stuffing material. In a preferred embodiment, pores 30 are filled with a carbon-based monomer as the stuffing material. This is illustrated schematically wherein the pores 30 are illustrated stuffed with stuffing material 32. It is believed that a carbon-based monomer is particularly well suited to act as a stuffing material 32 because of its propensity to form hydrogen bonds with the dielectric material 24. The formation of hydrogen bonds with the dielectric material surrounding the pores means that stuffing material 32 will stay confined within the pores 30 and is unlikely to out-gas during subsequent processing steps. Other materials, such as $NH_3$, $CF_4$, $CO_2$, and the like are also likely candidates as a stuffing material. Generally, an advantageous stuffing material will contain fluorine, nitrogen, chlorine or oxygen, in order to promote hydrogen bonding with the surrounding dielectric material. While not a requisite property, it is believed by the inventors that larger molecules are advantageous as a stuffing material, as they are more likely to substantially fill the pore and provide the desired mechanical strength.

Stuffing material 32 is preferably delivered to the pores 30 through the use of a carrier fluid. Preferably, super critical carbon dioxide ($SCCO_2$) is used as the carrier. As is well known in the art, super critical refers to the state of a material whereby the material is subjected to sufficient pressure and temperature such that the pressure and temperature exceeds its critical point. $SCCO_2$ is particularly well suited as a carrier fluid because $SCCO_2$ has negligible viscosity and effectively no surface tension. This means that the $SCCO_2$ will readily penetrate into small openings in the dielectric layer and will readily "wet" or penetrate into the pores 30. Although super critical carbon dioxide is a preferred carrier, other carriers such as nitrogen, argon, xenon, carbon dioxide, propane, ammonia, isopropanol, water, methane, and the like, especially in a super critical state, can also be employed as a carrier. It should be noted that, although carriers in a super critical state are preferred for the wetting capabilities, other carriers in a non-super critical state are well within the contemplated scope of the present invention. Any carrier that effectively delivers the stuffing material to and into the pores is sufficient. It is contemplated that in some embodiments, a carrier is not needed at all, provided that the stuffing material itself can sufficiently wet and penetrate the pores.

Figure 8:
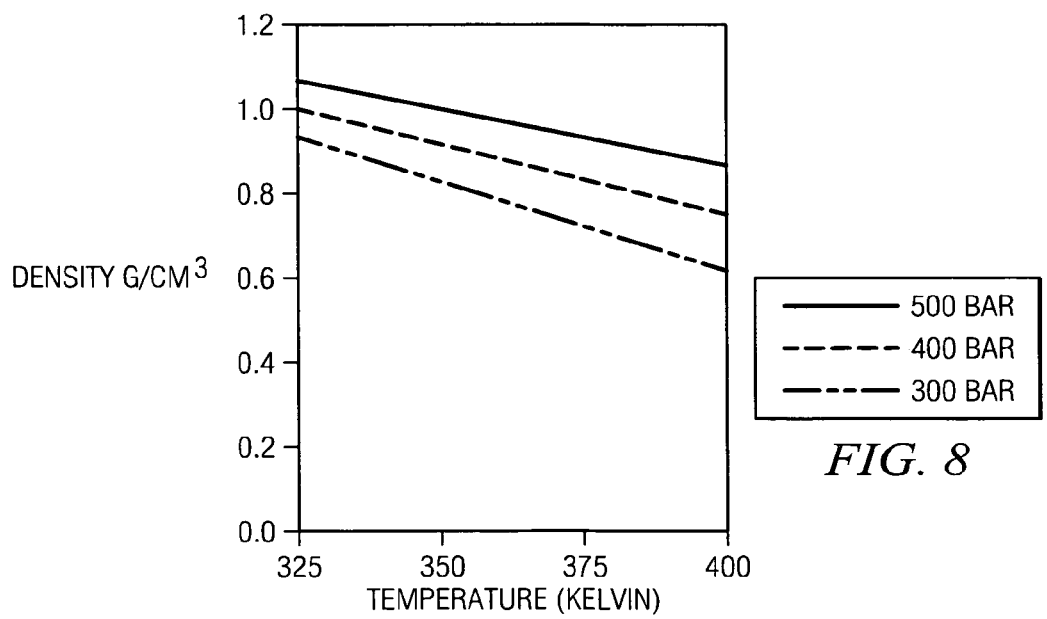
FIG. 8 illustrates the relationship between temperature and density for an exemplary super critical carrier fluid.

An exemplary process for delivering the stuffing material to the pores will now be described. In one example, stuffing material 32 is dissolved in $SCCO_2$. One skilled in the art will recognize that the parameters, such as temperature and pressure, necessary for dissolving the material in the carrier can be readily determined using, e.g., well known properties of the materials. For instance, FIG. 8 provides a graph of the temperature and density relationship for an exemplary carrier $SCCO_2$. For instance, in an exemplary embodiment, the semiconductor wafer will be placed in a high pressure chamber. Typically, $SCCO_2$, which has been pre-mixed with the stuffing material, is introduced into the chamber, preferably at a temperature of about 3000 psi to about 6000 psi and a temperature of between about 70 C to about 200 C for a duration of about one to ten minutes.

Figure 4:
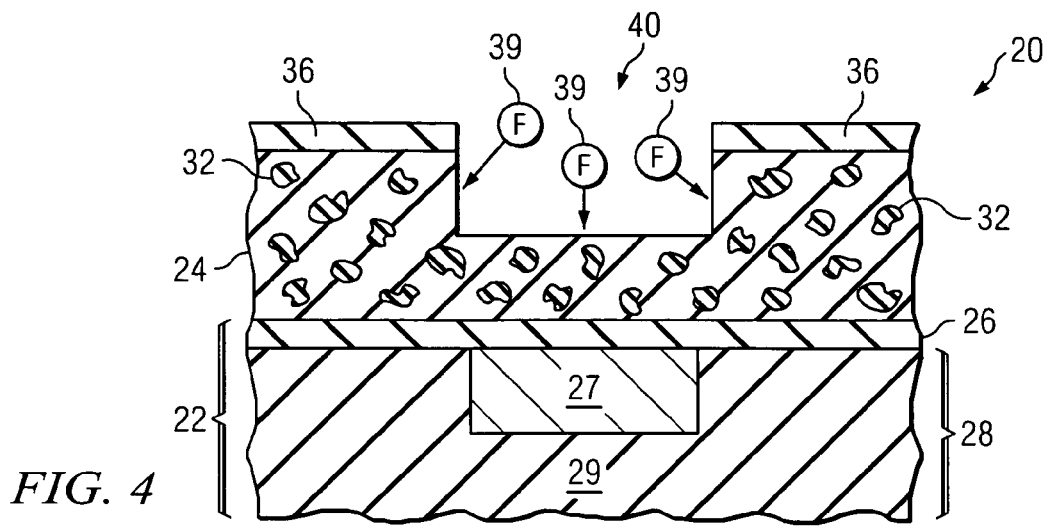
FIG. 4 schematically illustrates a step of etching the dielectric material of FIG. 3 using a fluorine containing etchant.

As illustrated in FIGS. 4 through 7, various process steps can next be performed with a significantly reduced likelihood of damaging low-k dielectric layer 24. As schematically illustrated in FIG. 4, the pores 30 are filled with the stuffing material 32, which provide mechanical strength to the material. As further shown in FIG. 4, a hard mask 36 is formed atop low-k dielectric layer 24 and patterned. Exposed portions of low-k dielectric layer 24 are then etched using, e.g., a fluorine containing etchant 39 to form an opening 40. Because pores 30 are filled with stuffing material 32, fluorine does not penetrate into the pores.

Figure 5:
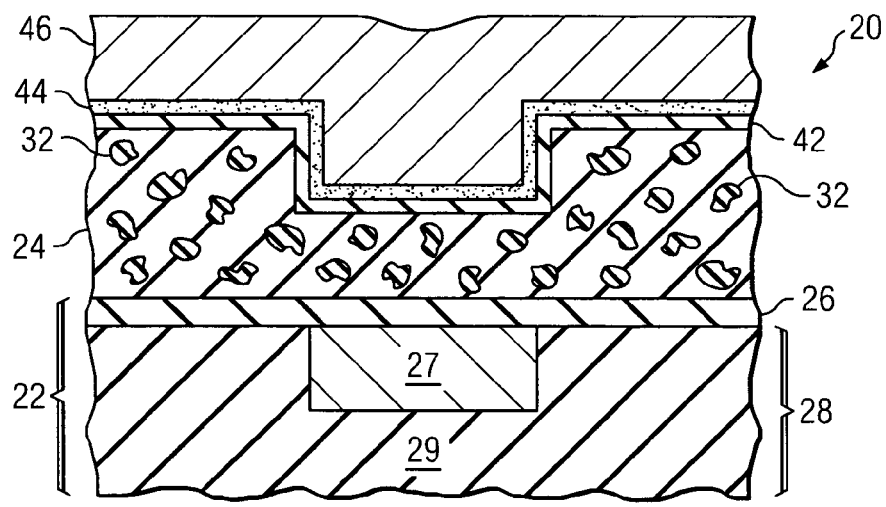
FIGS. 5 and 6 illustrate formation of a conductor in the dielectric material of FIG. 4.

As shown in FIG. 5, the sidewalls of opening 40 are lined with a barrier layer 42 and an adhesive layer 44, as is well known in the art of damascene processing. Preferably barrier layer 42 is formed of titanium or tantalum deposited by physical vapor deposition (PVD) or atomic layer deposition (ALD) to a thickness of about 5 Angstroms to about 50 Angstroms. Adhesive layer 44 is preferably titanium nitride or tantalum nitride deposited by PVD or ALD to a thickness of about 5 Angstroms to about 50 Angstroms. Next, copper conductor 46 is formed substantially filling, in fact overfilling, opening 40. Conductor 46 is preferably formed by first depositing a seed layer by PVD or CVD, followed by formation of conductor 46 by electroless plating, as is well known in the art.

Figure 6:
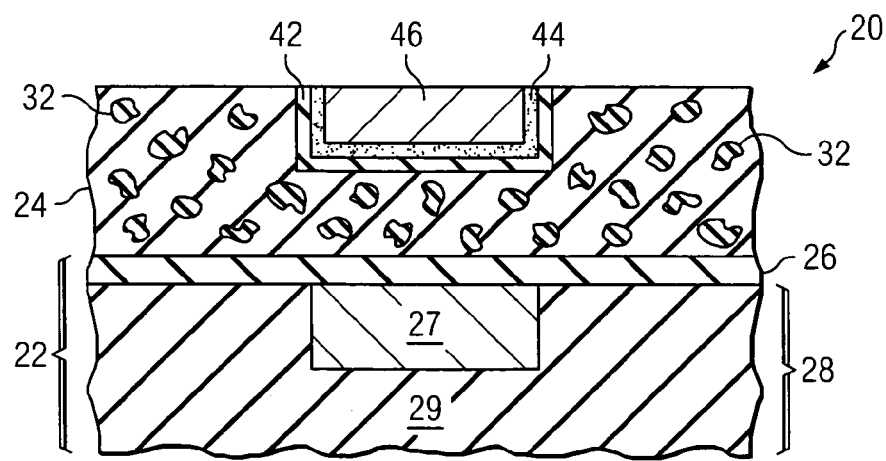

FIG. 6 illustrates the device of FIG. 5 after copper conductor 46 has been subjected to a chemical mechanical polish (CMP) step that polishes the top surface of conductor 46 (and barrier layer 42 and adhesive layer 44) to be substantially co-planar with the top of dielectric layer 24. Again, the presence of stuffing material 32 in pores 30 means that dielectric layer 24 maintains sufficient rigidity to withstand the pressures and shear stress of the CMP process without significant damage to the layer.

While stuffing material 32 strengthens dielectric layer 24 during processing, it will obviously have a higher dielectric constant, than air (k=1). Hence, it is desirable to substantially remove the stuffing material from the pores, after the processing on the dielectric layer has been substantially completed.

In a first preferred embodiment, stuffing material 32 is removed from dielectric layer 24 by reflowing $SCCO_2$ over the layer. Stuffing material 32 is once again dissolved in the $SCCO_2$ and can then be carried away from dielectric layer 24 by appropriately flushing or purging the $SCCO_2$ after the stuffing material has been removed. For instance, the wafer can be introduced to the high pressure chamber and exposed to $SCCO_2$ at a pressure of about 3000 to 6000 psi and a temperature of preferably about 70 C to about 150 C, again for about one to ten minutes. If necessary, infra-red (IR) imaging could be employed for end-point detection to determine the optimum duration for the exposure.

In an alternative embodiment, stuffing material is removed from dielectric layer 24 by a thermal baking step. In one such embodiment, the dielectric layer 24 is subjected to a temperature of about 250C to about 500C at a pressure of about 0 to about 1 atmospheres for a period of about 5 to about 60 minutes. In yet other alternative embodiments, stuffing material could be removed by UV curing, e-beam treatment, and the like. While preferably all stuffing material is removed, in alternate embodiments some, but not all, stuffing material is removed. One of ordinary skill in the art will appreciate that many processes can be employed to accomplish the objective of removing the stuffing material without degrading the mechanical and electrical properties of the dielectric material.

Figure 7:
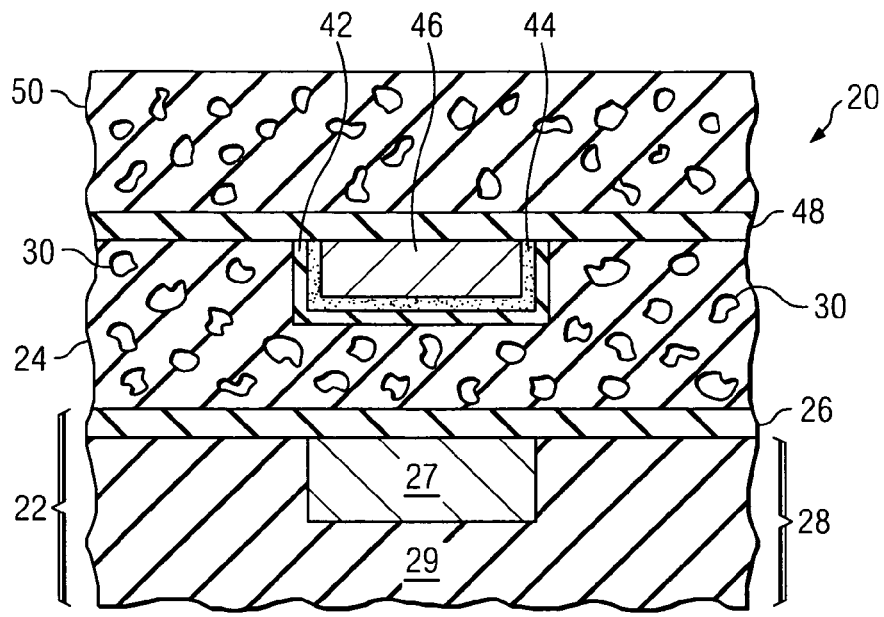
FIG. 7 illustrates formation of a second dielectric layer atop the structure of FIG. 6.

FIG. 7 illustrates dielectric layer 24 after stuffing material 32 has been removed from pores 30, subsequent to the CMP step. Also as illustrated in FIG. 7, further processing involves forming an etch stop layer 48 atop conductor 46 and dielectric layer 24, followed by formation of another low-k dielectric layer 50 atop etch stop layer 48. Second low-k dielectric layer 50 may comprise the same material as first low-k dielectric layer 24, or it may comprise a different low-k dielectric material or combination of materials. Preferably, low-k dielectric material 50 is also subjected to a stuffing material treatment in order to fill its pores during subsequent process steps, followed by an appropriate treatment to remove the stuffing material. The steps of depositing a dielectric material (and subjecting the material to a poregen removing step, if necessary), subjecting the material to a pore stuffing step, forming one or more damascene structures in the material, and performing a stuffing material removing step, can be repeated for as many dielectric layers are necessary for the manufacture of a complete integrated circuit.

Although the present invention and its advantages have been described in detail, it should be understood that various changes, substitutions and alterations can be made herein without departing from the spirit and scope of the invention as defined by the appended claims. For example, it is anticipated that materials and processes will continue to evolve in the relevant field of endeavor. The inventive concepts disclosed herein can be readily adapted to apply to future developed materials and processes.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of manufacturing an integrated circuit device comprising:
   forming on a substrate a layer having a plurality of pores therein;
   substantially filling the pores with a stuffing material, said stuffing material comprising a material selected from the group consisting essentially of gaseous nitrogen, oxygen, fluorine, chlorine, and combinations thereof; and
   removing at least some of the stuffing material from the pores.

2. The method of claim 1 further comprising performing at least one processing step after filling the pores and before removing the stuffing material.

3. The method of claim 1 wherein substantially filling the pores includes dissolving a stuffing material in a carrier fluid and introducing the carrier fluid into the pores.

4. The method of claim 1 wherein the layer is a first dielectric layer and further comprising:
   forming a conductor in the first dielectric layer; and
   forming a second dielectric layer over the first dielectric layer.

5. A method for forming an integrated circuit device comprising:
   forming over a substrate a low dielectric constant material having a plurality of pores;
   substantially filling the pores with a stuffing material, said stuffing material comprising a material selected from the group consisting essentially of gaseous nitrogen, oxygen, fluorine, chlorine, and combinations thereof;
   forming an opening in the low dielectric constant material;
   forming a conductor in the opening; and
   removing at least part of the stuffing material from the pores.

6. The method of claim 5 wherein said low dielectric constant material comprises a material selected from the group consisting essentially of silicon based carbon-doped oxides, polymer-based low-k materials, hydrogen silsequioxane, methyl silsequioxane, and combinations thereof.

7. The method of claim 5 wherein the low dielectric material is deposited by CVD or SOD.

8. The method of claim 5 wherein the pores are substantially filled with a stuffing material by dissolving the stuffing material in a carrier fluid.

9. The method of claim 8 wherein the carrier fluid is a supercritical fluid.

10. The method of claim 9 wherein the supercritical fluid is selected from a group consisting essentially of nitrogen, argon, xenon, carbon dioxide, propane, ammonia, isopropanol, methanol, and water.

11. The method of claim 5 wherein substantially all the stuffing material is removed by dissolving the stuffing material in a supercritical fluid.

12. The method of claim 5 wherein removing the stuffing material comprises a thermal baking step, a UV curing step, or an e-beam treatment.

13. A method of treating a dielectric layer comprising:
forming a dielectric layer on a surface;
treating the dielectric layer to form pores therein;
substantially filling the pores with a stuffing material, wherein some of the stuffing material forms hydrogen bonds with the dielectric layer;
performing at least one processing step on the dielectric layer after substantially filling the pores; and
removing at least some of the stuffing material from the pores after performing the at least one processing step.

14. The method of claim 13 wherein treating the dielectric layer includes an e-beam cure or an ultra-violet cure.

15. The method of claim 14 wherein the carrier is selected from the group consisting essentially of super critical carbon dioxide, super critical nitrogen, super critical argon, super critical xenon, super critical propane, super critical ammonia, super critical isopropanol, super critical methanol, super critical water, and combinations thereof.

16. The method of claim 13 further including:
dissolving the stuffing material in a carrier to introduce the stuffing material into the pores.

17. The method of claim 13 wherein the at least one processing step includes an etch step, a plasma treatment step, an ashing step, or a chemical mechanical polishing step.

18. The method of claim 13 wherein the removing at least some of the stuffing material comprises dissolving the stuffing material substantially filling the pores in a super critical carrier fluid and flushing the dissolved stuffing material and carrier fluid.

* * * * *